United States Patent
Takahashi et al.

(10) Patent No.: US 6,287,892 B1
(45) Date of Patent: Sep. 11, 2001

(54) SHOCK-RESISTANT SEMICONDUCTOR DEVICE AND METHOD FOR PRODUCING SAME

(75) Inventors: Nobuaki Takahashi; Yoshitaka Kyougoku; Katsumasa Hashimoto; Shinichi Miyazaki, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/460,375

(22) Filed: Dec. 13, 1999

Related U.S. Application Data

(62) Division of application No. 09/061,165, filed on Apr. 16, 1998, now Pat. No. 6,025,648.

(30) Foreign Application Priority Data

Apr. 17, 1997 (JP) .................................................. 9-099502

(51) Int. Cl.[7] .................................................... H01L 21/48
(52) U.S. Cl. ........................... 438/107; 438/109; 438/126
(58) Field of Search ..................................... 438/106, 107, 438/108, 109, 117, 118, 119, 120, 121, 123, 124, 125, 126, 127; 257/685, 686, 687, 688, 699; 361/820

(56) References Cited

U.S. PATENT DOCUMENTS

| | | |
|---|---|---|
| 4,709,468 * | 12/1987 | Wilson . |
| 5,001,542 | 3/1991 | Tsukagoshi et al. . |
| 5,404,044 | 4/1995 | Booth et al. . |
| 5,600,541 | 2/1997 | Bone et al. . |
| 5,715,144 | 2/1998 | Ameen et al. . |
| 5,727,310 | 3/1998 | Casson et al. . |
| 5,786,635 | 7/1998 | Alcoe et al. . |
| 5,790,384 | 8/1998 | Ahmad et al. . |
| 5,798,567 | 8/1998 | Kelly et al. . |
| 5,801,448 | 9/1998 | Ball . |
| 5,805,422 | 9/1998 | Otake et al. . |
| 5,825,080 | 10/1998 | Imaoka et al. . |
| 5,834,848 | 11/1998 | Iwasaki . |
| 5,883,426 | 3/1999 | Tokuno et al. . |
| 5,994,166 * | 11/1999 | Akram et al. . |
| 6,025,648 * | 2/2000 | Takahashi et al. . |
| 6,051,878 * | 4/2000 | Akram et al. . |
| 6,143,590 * | 11/2000 | Ohki et al. . |
| 6,147,401 * | 11/2000 | Solberg . |
| 6,222,265 * | 4/2001 | Akram et al. . |

FOREIGN PATENT DOCUMENTS

| | | |
|---|---|---|
| 2-42739 | 2/1990 | (JP) . |
| 3-270030 | 12/1991 | (JP) . |
| 3-278511 | 12/1991 | (JP) . |
| 4-280667 | 10/1992 | (JP) . |
| 6-275775 | 9/1994 | (JP) . |
| 7-183426 | 7/1995 | (JP) . |
| 8-236694 | 9/1996 | (JP) . |
| 02000286380-A * | 10/2000 | (JP) . |

* cited by examiner

*Primary Examiner*—Charles Bowers
*Assistant Examiner*—Evan Pert
(74) *Attorney, Agent, or Firm*—Young & Thompson

(57) ABSTRACT

A plurality of substrate to which have been flip-chip mounted semiconductor chips are laminated by solder bumps provided for the purpose of lamination. A elastic resin is caused to fill the space between the chip upper surface and the substrate, thus providing a shock-absorbing material layer.

10 Claims, 2 Drawing Sheets

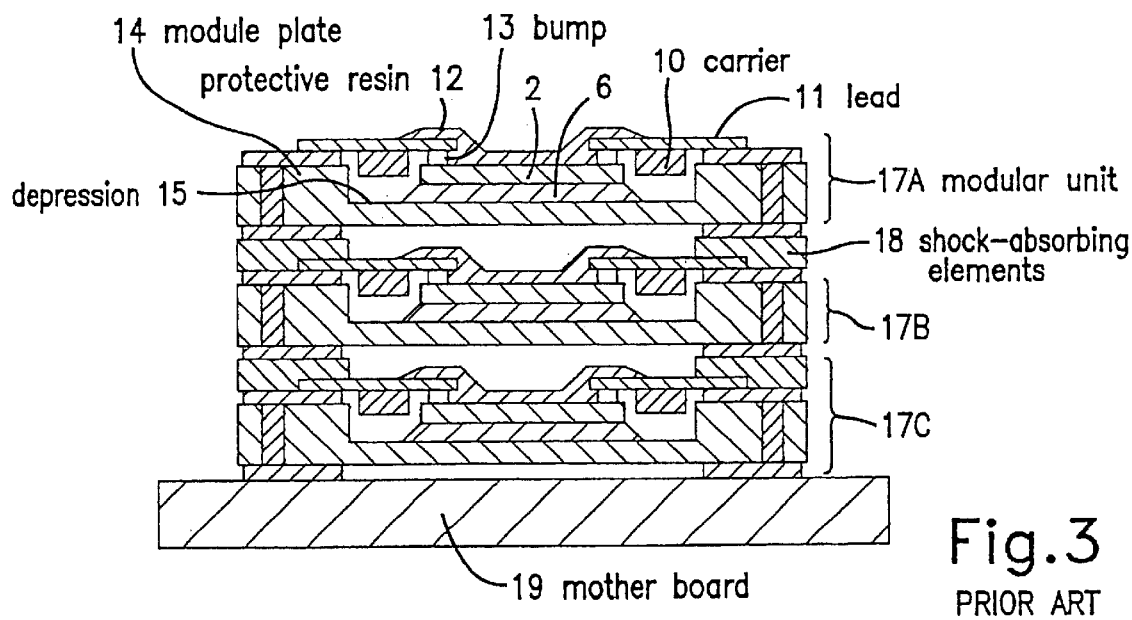
Fig.3
PRIOR ART
Fig.4 (a)
PRIOR ART
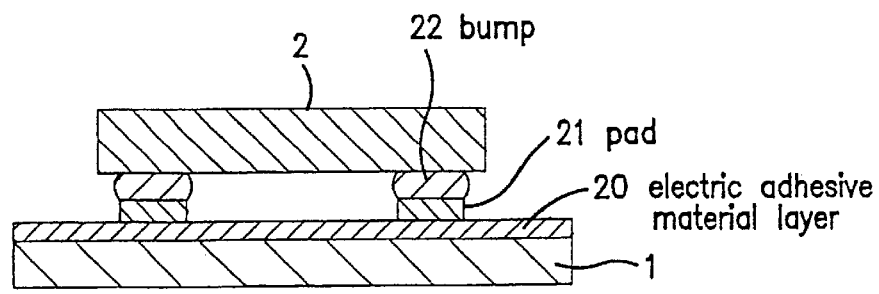
Fig.4 (b)
PRIOR ART
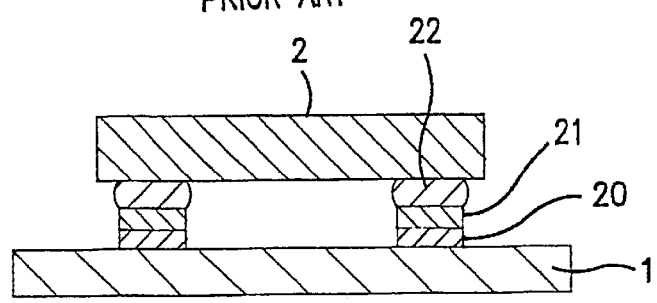

SHOCK-RESISTANT SEMICONDUCTOR DEVICE AND METHOD FOR PRODUCING SAME

CROSS-REFERENCE TO RELATED APPLICATIONS

This application is a division of application Ser. No. 09/061,165, filed Apr. 16, 1998, now U.S. Pat. No. 6,025, 648.

BACKGROUND OF THE INVENTION

1. Field of the Invention

The present invention relates to a semiconductor device, and more specifically to a semiconductor device having a three-dimensionally laminate structure of a bare chip on a substrate.

2. Description of Related Art

To achieve higher density, compactness, and larger capacity in a semiconductor chip, particularly with regard to packaging of semiconductor memory devices, the method of three-dimensional lamination of chips is widely used. By using this structure, it is possible to achieve a great reduction in mounting surface area.

However, when three-dimensional mounting is done, because differences in coefficients of thermal expansion, stress and strain caused by thermal history, and subsequent failed connections can occur. In applications to spacecraft, it is necessary to consider immunity to vibration and shock as well, and several related methods have been proposed.

For example, as noted in Japanese Unexamined Patent Publication No. 6-275775 and shown in FIG. 3, there is a structure in which a chip 2 is mounted to a TAB (tape automated bonding) tape, to form a TAB device, this having a three layer laminated structure (17A through 17C) mounted on a motherboard 19.

In FIG. 3, the chip 2 is connected to carrier 10 via the lead 11 by a bump 13 or by the flip-chip method. The TAB tape side part of the chip 2 is covered by a protective resin 12. The TAB device is mounted on a module plate 14. The module plate 14 is made from a material that has good resistance to heat and that has as good a thermal conductivity as possible.

When-mounting the TAB device to the module plate 14, the TAB device is mounted within the depression 15 of the module plate 14, so that the rear surface of the chip 2 makes contact with the inside surface of the depression 15, using an adhesive material 6 that has good thermal conductivity. The outer lead part of the lead 11 of the TAB device is connected to to a connection pattern on the outer surface of the module plate 14, thereby forming the module units 17A through 17C, which are made of TAB devices and module plates 14.

A plurality of modular units 17A through 17C are laminated with an intervening shock-absorbing element 18 therebetween. Because the shock-absorbing elements 18 are made of an anistropic electrically conductive resin or an anisotropic electrically conductive rubber and are configured so that there is conduction only in the up/down direction, the laminated modular units are electrically connected. By virtue of the above-noted structure, the shock-absorbing elements 18 absorb externally applied shock and vibration, thereby providing an improvement in the vibration immunity of the device.

Other prior art is disclosed in the Japanese Patent Publication H2-42739. As shown in FIG. 4(a), a elastic adhesive material layer 20 is formed on an insulating substrate 1. Pads 21 and a wiring pattern are formed on top of this elastic adhesive material layer 20. Next, a chip 2 is connected to the top of the pads 21 by means of the bumps 22.

As shown in FIG. 4(b), after forming an elastic adhesive material layer 20 on the top of an insulating substrate 1, parts other than the pads 21 and the wiring pattern are removed by etching. Then, a chip 2 is connected to the top of the remaining pads 21 using the bumps 22.

By adopting a structure such as described above, the elastic adhesive material layer 20 acts as a shock-absorbing layer which intervenes between the chip 2 and the substrate 1, thereby improving the connection reliability therebetween.

In the prior art that was disclosed in the Japanese Unexamined Patent Publication No. 6-275775, modular units are laminated and the material used for the purpose of making electrical connections therebetween is an anisotropic electrically conductive resin or an anisotropic electrically conductive rubber. In general, anisotropic electrically conductive resin and anisotropic electrically conductive rubber present the problem of having a large electrical resistance compared with a metal, thereby making actual low-voltage applications, particularly to memory chips, difficult.

In the prior art that is noted in the Japanese Patent Publication H2-42739, solder is used for the connection between the substrate and the chip, and it is realistic to use flux for the purpose of making a reliable connection therebetween. However, if there are residual halogen ions remaining in the flux, it is known that an adverse affect will result on the bare chip.

For this reason, it is desirable to avoid the use of solder in precision equipment such as that used in spacecraft, and to use a material such as gold or the like which does not require flux. In the case of making a flip-chip connection using bumps made of gold, it is necessary to apply force and vibration as well as heat. When this is done, to achieve a reliable connection, it is necessary for the land to have some degree of hardness.

However, in the above-noted prior art, it is difficult to make a connection a bump made of gold or the like with a land on the substrate, because an elastic adhesive material is provided immediately below the land. Additionally, the manufacturing process is complex, and the cost is high.

In view of the above-described drawbacks in the prior art, an object of the present invention is to provide a semiconductor device capable of improving immunity to vibration and shock and having an extremely simple structure.

Accordingly, the object of the present invention is to provide a semiconductor device in which when a plurality of substrates are stacked, the connecting portion can be made with a greater electrical conductivity and can be driven with a relatively lower voltage level.

SUMMARY OF THE INVENTION

To achieve the above-noted object, the present invention is a method of producing semiconductor device having a laminated structure in which a plurality of substrates on one of surfaces of which semiconductor chips are mounted, are laminated and mutually connected electrically to each other, said structure comprising a shock-absorbing material which can absorb shock and vibration disposed between an upper surfaces of said semiconductor chip and another surface of said substrate opposite to said surface thereof.

The present invention includes a method for producing a semiconductor device having laminated structure in which a plurality of substrates on one of surfaces of which semiconductor chips are mounted, are laminated and mutually connected electrically to each other, said method comprising the steps of; a first step of forming a metallic bump on a surface of semiconductor device; a second step of coating a pad portion of said substrate with the metal so as to assemble said semiconductor chip with said substrate; a third step of connecting said semiconductor device to said substrate utilizing a flip-chip method; a fourth step of sealing the connecting portion of said connected portion with sealing resin; a fifth step of disposing solder bumps between said substrate each being made in said third step and stacking a plurality of said substrates each other; a sixth step of electrically connecting said stacked substrates with each other; and a seventh step of filling a shock-absorbing material which can absorb shock and vibration, between an upper surface of said semiconductor chip and another surface.

According to the present invention, a semiconductor device having a laminated construction is provided which includes a first substrate and a second substrate onto which chips are mounted, the above-noted second substrate being mounted on the above-noted first substrate, and a shock-absorbing material being provided between the front surface of the semiconductor chip on the first substrate and the rear surface of the second substrate.

A feature of the present invention is that the above-noted first and second substrates are mutually connected by means of bumps that are metal electrodes, and that the space between the above-noted laminated substrates is filled with the above-noted shock-absorbing material.

The effect of the present invention is that, by providing a elastic shock-absorbing material between the substrates onto which chips have been laminated and mounted, vibration and shock which are applied externally are absorbed, thereby improving the immunity to vibration and shock.

DESCRIPTION OF THE DRAWINGS

FIG. 3 is a cross-sectional view of a mounting structure of a semiconductor device in the prior art.

FIGS. 4(a) and 4(b) are cross-sectional views of a mounting structure of a semiconductor device in the prior art.

DETAILED DESCRIPTION OF THE PREFERRED EMBODIMENTS

Embodiments of present invention are described below, with reference being made to the relevant accompanying drawings.

Figure 1:
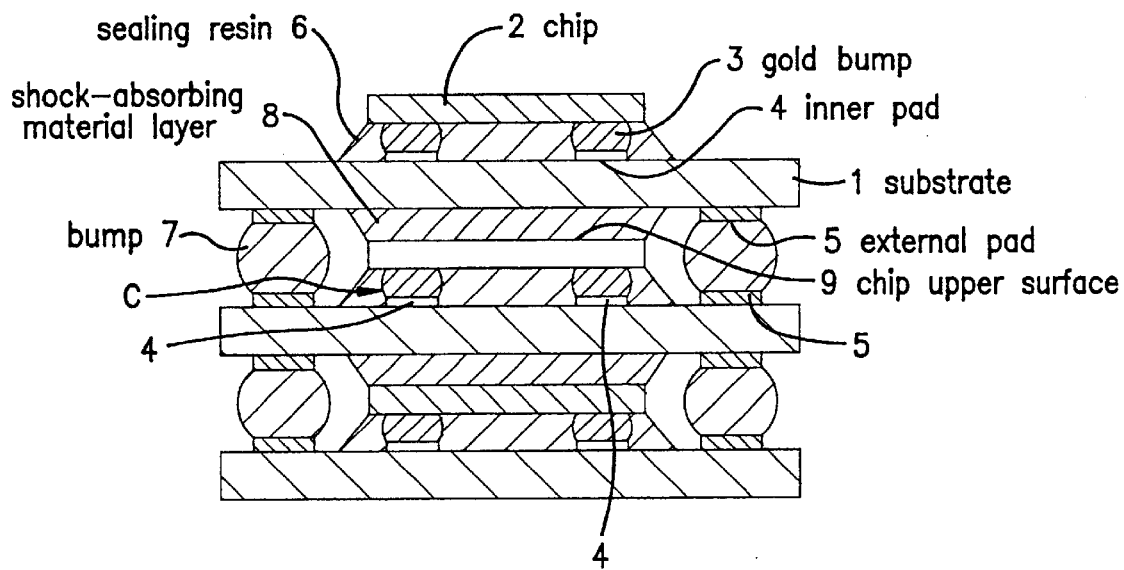
FIG. 1 is a cross-sectional view of the mounting structure of a semiconductor device according to one embodiment of the present invention.

FIG. 1 is a cross-sectional view of the mounting structure of a semiconductor device according to one embodiment of the present invention. The method of fabrication thereof will be described below, with reference being made to FIG. 1. A substrate 1 made of, for example alumina or ceramic or the like, onto which internal pads 4 and a wiring pattern are formed and a chip 2 on which the gold bumps 3 are formed are flip-chip connected. The gold bumps 3 are fabricated by the ball method, for example, using gold wire.

On the internal pads 4 on the substrate side, to assure a reliable connection by the gold bumps 3, gold is formed to a thickness of 1 to 5 $\mu$m beforehand, using either plating or sputtering. When the flip-chip connection is made, the application of heat and pressure or vibration are both used to effect a hot-press bond. Then, a sealing resin 6 is injected between the chip 2 and the substrate 1, and the connected portion C of gold bump 3 is covered with resin 6, and this resin 6 is cured to make a seal.

Then, a shock-absorbing material layer 8 which has elasticity is provided on the chip surface 9, and semi-cured. A shock-absorbing material for the present invention is made from silicone resin or epoxy resin or the like which has elasticity. On the external pads 5 on the substrate 1 on which the chip 2 is mounted, bumps 7 for lamination are formed. The lamination bumps 7 are formed, for example, by placing lead-tin solder balls on the external pads 5 using the viscosity of flux or the like, and heating so as to fuse them. The height of the thus-formed bumps 7 is made at least higher than the height from the surface of the substrate 1 to the surface of the shock-absorbing material layer 8, by selecting the solder ball size.

Next, a plurality of substrates 1 onto which the chip 2 is mounted are laminated, reflow is used to melt the solder to make all connections at one time. Simultaneously with this, the shock-absorbing material layer 8 is completely cured, thereby forming the mounting structure for the semiconductor that is shown in FIG. 1. Resin can also be injected after the lamination process to form the shock-absorbing material layer 8.

By adopting the above-described semiconductor mounting structure, because there is a elastic shock-absorbing material layer 8 made of resin between the chip upper surface 9 and the substrate 1, externally applied vibration and shock are absorbed, thereby improving the immunity to vibration and shock. Additionally, because connections between substrates 1 are made by means of metal (solder) bumps 7, the electrical resistance is low. Additionally, because there is no elastic layer under the internal pads 4 of the substrate, it is possible to establish a good connection between the chip 2 and the substrate 1 by means of bumps made of gold or the like.

Although the example described is that of using gold bumps to connect the chip 2 to the substrate 1, it is also possible to use solder bumps or the like.

Figure 2:
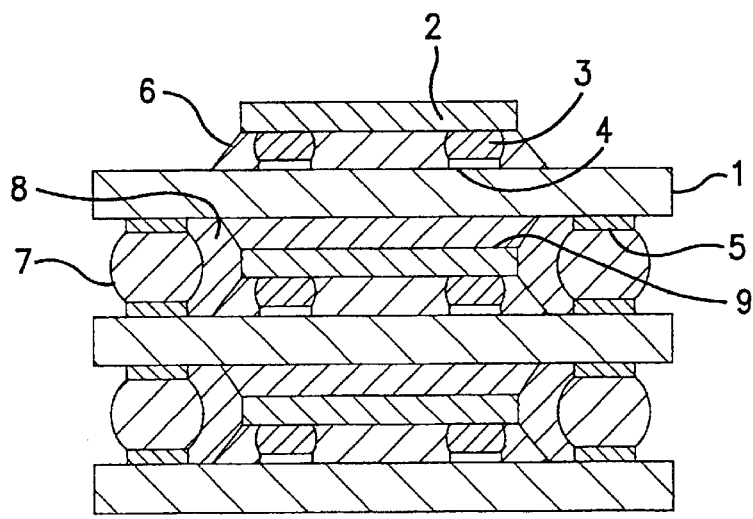
FIG. 2 is a cross-sectional view of the mounting structure of a semiconductor device according to another embodiment of the present invention.

FIG. 2 is a cross-sectional view of the mounting structure of a semiconductor device according to another embodiment of the present invention. A substrate 1 on which are formed internal pads 4 and a wiring pattern and a chip 2 are flip-chip connected. On the internal pads of the substrate 1, to assure a reliable connection by gold bumps 3, gold layer is formed to a thickness of 1 to 5 $\mu$m beforehand, using either plating or sputtering. When the flip-chip connection is made, the application of heat and pressure or vibration are both used to effect a hot-press bond.

Then a resin 6 for sealing is injected between the chip 2 and the substrate 1, and is cured. Then on the external pads 5 on the substrate on which the chip 2 is mounted, bumps 7 for lamination are formed. The lamination bumps 7 are formed from, for example, lead-tin solder. Next, a plurality of substrates 1 onto which chips 2 have been mounted is laminated, and reflow is used to melt to solder to make all connections at one time. Next, an elastic resin is injected to fill the space between each substrate 1, this is caused to be cured, so as to form the shock-absorbing material layer 8, thereby obtaining the semiconductor mounting structure that is shown in FIG. 2.

In the case in which it is not possible to sufficiently inject resin in the space between the bottom surface of the substrate 1 and the top surface 9 of the chip because this space is too narrow, after forming the substrates 1 having the chip 2 in the same manner as the first embodiment, a elastic resin is injected in the space between the substrates 1, this being used as the shock-absorbing material layer 8, thereby obtaining the semiconductor mounting structure that is shown in FIG. 2.

By adopting the above-noted semiconductor mounting structure, because there is an elastic shock-absorbing material layer 8 between each of the laminated substrates, externally applied vibration and shock are absorbed, thereby improving the immunity to vibration and shock. Additionally, because connections between substrates 1 are made by means of metal (solder), the electrical resistance is low. Additionally, because there is no elastic layer under the internal pads 4 of the substrate, it is possible to establish a good connection between the chip 2 and the substrate 1 by means of bumps made of gold or the like.

Although the example described is that of using gold bumps to connect the chip 2 to the substrate 1, it is also possible to use solder bumps or the like.

According to the present invention as is described above, because an elastic shock-absorbing material is provided between substrates already having chips mounted to them which are laminated and connected, externally applied vibration and shock are absorbed such that immunity to vibration and shock is improved. The present invention is able to use three-dimensionally laminated modules for applications such as space craft and vehicles, which are subject to vibration and shock.

What is claimed is:

1. A method of producing a stacked semiconductor device having a laminated structure, comprising the steps of:
    forming plural semiconductor sub-units by
        forming a metallic bump on a lower surface of each of plural semiconductor devices,
        coating a pad portion on an upper surface of each of plural substrates, the pad portions and metallic bumps being positioned so as to allow contact-alignment between corresponding ones of the plural semiconductor devices and the plural substrates, and
        utilizing a flip-chip method, joining the corresponding plural semiconductor devices and plural substrates to form the plural semiconductor sub-units;
    for each of the plural semiconductor sub-units, injecting a sealing resin into a connecting region defined between the upper surface of each of the substrates and the lower surface of the joined semiconductor device so as to seal the connecting region of each semiconductor sub-unit;
    providing on the upper surface of the substrates of some of the semiconductor sub-units, in a region apart from the connecting region, a sub-unit connecting bump;
    vertically stacking the plural semiconductor sub-units on-upon-another so that a second semiconductor unit is stacked atop a first semiconductor unit and so that the connecting bump of the first semiconductor sub-unit is joined to a lower surface of the second semiconductor sub-unit;
    electrically connecting the first stacked semiconductor sub-unit to other semiconductor sub-units; and
    injecting a shock-absorbing material to fill a region between an upper surface of the semiconductor device of the first semiconductor sub-unit and the lower surface of the substrate of the second semiconductor sub-unit.

2. The method of claim 1, wherein the metallic bump and the pad portion are made of gold.

3. The method of claim 1, wherein, in the step of forming the plural semiconductor sub-units, each of the substrates of the plural semiconductor sub-units are sized to have the same perimeter dimensions.

4. The method of claim 3, wherein, in the step of forming the plural semiconductor sub-units, each of the plural semiconductor devices is selected to have the same size.

5. The method of claim 4, wherein, in the step of injecting the shock-absorbing material into the region between an upper surface of the semiconductor device of the first semiconductor sub-unit and the lower surface of the substrate of the second semiconductor sub-unit, the injecting of the shock-absorbing material is continued until the shock-absorbing material fills a region from the upper surface of the first semiconductor sub-unit substrate to the lower surface of the second semiconductor sub-unit substrate and contacts the connecting bump joining the first and second semiconductor sub-units.

6. The method of claim 1, wherein, the step of injecting the shock-absorbing material fills a region from the upper surface of each semiconductor sub-unit substrate to the lower surface of the a corresponding joined semiconductor sub-unit substrate and contacts the connecting bump joining the semiconductor sub-units.

7. A method of producing a stacked semiconductor device having a laminated structure, comprising the steps of:
    forming at least three semiconductor units by
        forming a metallic bump on a lower surface of each of at least three semiconductor chips,
        providing a pad portion on an upper surface of each of at least three substrates, the pad portions and metallic bumps being positioned so as to allow alignment between corresponding ones of the semiconductor chips and the substrates, and
        utilizing a flip-chip method, joining the corresponding semiconductor chips and substrates to form the at least three semiconductor units;
    for each of the semiconductor units, injecting a sealing resin into a connecting region defined from the upper surface of each of the substrates and to the lower surface of the joined semiconductor chips so as to seal the connecting region of each semiconductor unit;
    providing, on the upper surface of the substrates of at least two of the semiconductor units, a unit lamination bump;
    stacking, in vertical alignment, the semiconductor units so that a second semiconductor unit is stacked atop a first semiconductor unit and so that the lamination bump of the first semiconductor unit is joined to a lower surface of the second semiconductor unit;
    filling a shock-absorbing material into a region between an upper surface of the semiconductor device of the first semiconductor sub-unit and the lower surface of the substrate of the second semiconductor sub-unit;
    electrically connecting the stacked semiconductor units to each other; and
    curing the shock-absorbing material.

8. The method of claim 7, wherein each of the substrates comprise ceramic.

9. The method of claim 7, further comprising a step of curing between the step of injecting the sealing resin into the connecting region and the step of providing the unit lamination bump.

10. A method of producing a stacked semiconductor device having a laminated structure, comprising the steps of:

forming at least three semiconductor units by forming a metallic bump on a lower surface of each of at least three semiconductor chips, providing a pad portion on an upper surface of each of at least three substrates, the pad portions and metallic bumps being positioned so as to allow alignment between corresponding ones of the semiconductor chips and the substrates, and utilizing a flip-chip method, joining the corresponding semiconductor chips and substrates to form the at least three semiconductor units;

for each of the semiconductor units, injecting a sealing resin into a connecting region defined from the upper surface of each of the substrates and to the lower surface of the joined semiconductor chips so as to seal the connecting region of each semiconductor unit;

curing the sealing resin;

providing a shock-absorbing material layer on an upper surface of the semiconductor chips of a least two of the semiconductor units;

providing, on the upper surface of the substrates of at least two of the semiconductor units, a unit lamination bump sized to extend from the upper surface of the substrate to a height higher than an upper surface of the shock-absorbing material layer;

stacking, in vertical alignment, the semiconductor units so that a second semiconductor unit is stacked atop a first semiconductor unit and so that the lamination bump of the first semiconductor unit is joined to a lower surface of the second semiconductor unit; and curing the shock-absorbing material.

* * * * *

UNITED STATES PATENT AND TRADEMARK OFFICE
CERTIFICATE OF CORRECTION

PATENT NO. : 6,287,892 B1
DATED : September 11, 2001
INVENTOR(S) : Nobuaki Takahashi et al.

It is certified that error appears in the above-identified patent and that said Letters Patent is hereby corrected as shown below:

<u>Title page, Item [54] and Column 1, Lines 1-3,</u>
Change the title to -- METHOD FOR PRODUCING SHOCK-RESISTANT STACKED SEMICONDUCTOR DEVICE MODULE --.

Signed and Sealed this

Eleventh Day of June, 2002

*Attest:*

*Attesting Officer*

JAMES E. ROGAN
*Director of the United States Patent and Trademark Office*